United States Patent
Flynn (10) Patent No.: US 6,175,323 B1
(45) Date of Patent: Jan. 16, 2001

(54) DIFFERENTIAL PAIR-BASED FOLDING INTERPOLATOR CIRCUIT FOR AN ANALOG-TO-DIGITAL CONVERTER

(75) Inventor: Michael P. Flynn, Washington, MI (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/133,895

(22) Filed: Aug. 13, 1998

(51) Int. Cl.$^7$ .................................................... H03M 1/12
(52) U.S. Cl. .............................................. 341/156; 341/155
(58) Field of Search ................................. 341/155, 156, 341/159, 145; 327/91, 540; 331/1 A, 57

(56) References Cited

U.S. PATENT DOCUMENTS

| | | |
|---|---|---|
| 4,831,379 | 5/1989 | van de Plassche ............... 341/156 |
| 4,897,656 | 1/1990 | van de Plassche et al. ........ 341/159 |
| 5,051,746 | 9/1991 | van de Grift et al. ............. 341/159 |
| 5,319,372 | 6/1994 | Yee ..................................... 341/156 |
| 5,392,045 | 2/1995 | Yee ..................................... 341/156 |
| 5,633,638 | 5/1997 | Venes et al. ........................ 341/155 |
| 5,640,163 | * 6/1997 | Nauta et al. ........................ 341/155 |
| 5,751,236 | * 5/1998 | Vorenkamp et al. ............... 341/155 |

FOREIGN PATENT DOCUMENTS

| | | |
|---|---|---|
| 0227165B1 | 12/1986 | (EP) . |
| WO 92/08288 | 5/1992 | (WO) . |
| 9500519 | 6/1995 | (WO) . |
| WO 97/09788 | 3/1997 | (WO) . |

OTHER PUBLICATIONS

Roovers et al, "Design of CMOS ADCs with Folding and/or Interpolating Techniques," IEE, 1994.*

Kim et al, "An 8-bit 42 Ms/s Current Mode Folding and Interpolation CMOS ADC . . . ," IEEE, 1997.*

Venes, et al., "An 80–MHz, 8–mW, 8–b CMOS Folding A/D Converter with Distributed Track–and–Hold Preprocessing," IEEE Journal of Solid–State Circuits, vol. 31, No. 12, Dec. 1996.

Leuven, et al., "A 100 Mhz 8 Bit CMOS Interpolating A/D Converter," IEEE 1993 Custom Integrated Circuits Conference.

Flynn, et al., "CMOS Folding A/D Converters with Current–mode Interpolation," Research Report No. CMUCAD–96–35, Jul. 1996.

Flynn, et al., "CMOS Folding A/D Converters with Current–Mode Interpolation," IEEE Journal of Solid–State Circuits, vol. 31, No. 9, Sep. 1996.

Flynn, et al., "CMOS Folding ADCs with Current–Mode Interpolation," 1995 EEE International Solid–State Circuits Conference, Paper FA 16.2, Feb. 17, 1995.

* cited by examiner

*Primary Examiner*—Patrick Wamsley
(74) *Attorney, Agent, or Firm*—Wade James Brady, III; Fred J. Telecky, Jr.

(57) ABSTRACT

A current folding and interpolating circuit (80) in an analog-to-digital converter (10, 152) has L folders, each of them includes M differential pairs (82, 84), each having N first transistors (86–89, 100–103) biased by an input voltage and N second transistors (90–93, 96–99) biased by a reference voltage, and a current source (110, 112) coupled to the source terminals of the first and second transistors. The second transistors of different differential pairs are biased with different reference voltages. Selected drain terminals of the first transistors (89) of one folder (82) are coupled to selected drain terminals of the first transistors (100) of at least one other folder (84), and selected drain terminals of the second transistors (93) of one folder (82) are coupled to selected drain terminals of the second transistors (96) of at least one other folder (84). More than one interpolated signals may be generated between two folders.

16 Claims, 5 Drawing Sheets

DIFFERENTIAL PAIR-BASED FOLDING INTERPOLATOR CIRCUIT FOR AN ANALOG-TO-DIGITAL CONVERTER

TECHNICAL FIELD OF THE INVENTION

This invention is related in general to the field of electronic circuits. More particularly, the invention is related to a differential pair-based folding interpolator circuit for an analog-to-digital converter.

RELEVANT APPLICATIONS

The following U.S. Patents are hereby incorporated by reference: U.S. Pat. No. 5,633,638, issued on May 27, 1997 to Venes, et al., titled Folding Stage for a Folding Analog-to-Digital Converter; U.S. Pat. No. 5,392,045, issued on Feb. 21, 1995 to Yee, titled Folder Circuit for Analog to Digital Converter; U.S. Pat. No. 5,319,372, issued on Jun. 7, 1994, to Yee, titled Analog to Digital Converter That Decodes MOBS from Internal Voltages of Two Folder Circuits; U.S. Pat. No. 5,051,746, issued on Sep. 24, 1991 to van de Grift, et al., titled Interpolation Circuit for Use in an A/D Converter; U.S. Pat. No. 4,897,656, issued on Jan. 30, 1990 to van de Plassche, et al., titled Complementary Voltage Interpolation Circuit with Transmission Delay Compensation; and U.S. Pat. No. 4,831,379, issued on May 16, 1989 to van de Plassche, titled Complementary Voltage Interpolation Circuit.

BACKGROUND OF THE INVENTION

Advances in consumer electronics are creating a need for high speed analog-to-digital converters in applications such as high definition television (HDTV), magnetic recording sampling detectors, medical imaging, and digital transmission links for telecommunications and cable networks. Many of these applications are implemented in CMOS (complementary metal oxide semiconductor) rather than the more expensive BiCMOS technology.

Flash analog-to-digital converters (ADC) have been employed to realize very high speed conversions. The analog input voltage is fed to $2^N-1$ comparators in parallel which are coupled to a resistor ladder producing a predetermined number of ascending reference voltages. The comparators generate a cyclic thermometer code according to the input voltage level as compared with the reference voltage levels. The cyclic thermometer code is then decoded to produce the digital output. Flash analog-to-digital converters are fast but need a large number of comparators which typically require large areas and have high power consumption. Further, the large number of comparators connected to the input voltage result in a large parasitic load at the input node. Such a large capacitive load limits the speed of the converter.

Figure 1:
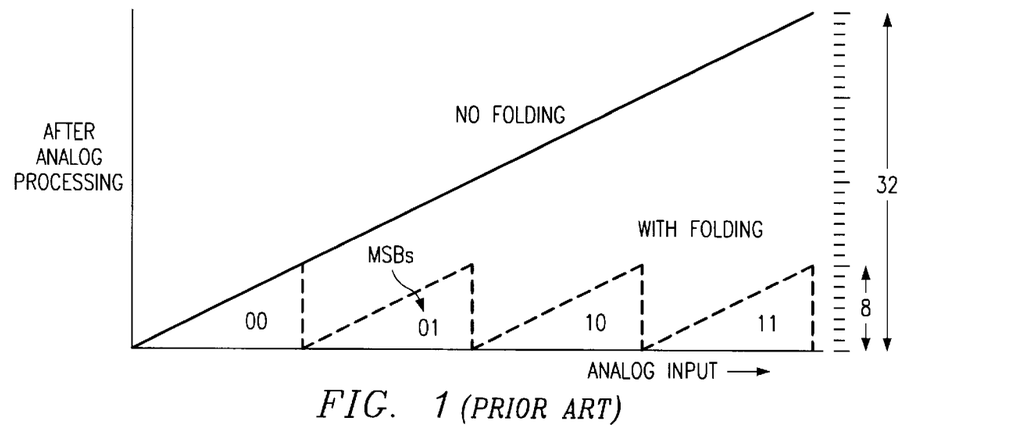
FIG. 1 is a graphical representation of the folding concept.
Figure 2A:
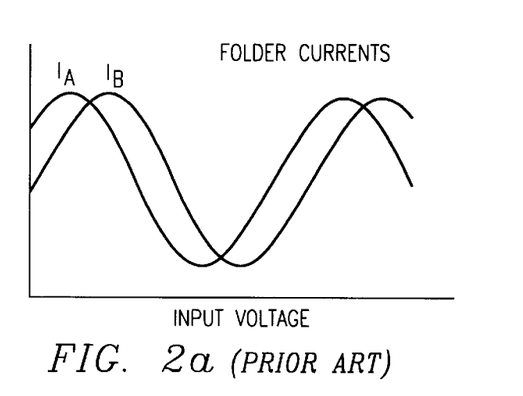
FIGS. 2A and 2B are graphical representations of the interpolation concept.
Figure 2B:
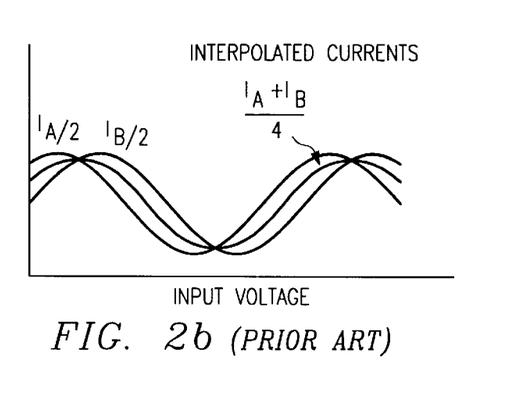

Accordingly, techniques have been sought to reduce the number of comparators needed in a flash analog-to-digital converter. Folding is an analog preprocessing step used to achieve this end. The number of comparators required is reduced by the degree of folding. FIG. 1 is a graphical representation of the folding concept for a 5-bit converter with a folding factor of four. Folders used to generate folded signals are typically implemented with cross-coupled differential pairs. Interpolating is another technique that may be combined with folding to generate intermediate folded signals to reduce the number of folders required to generate the same number of folded signals. FIGS. 2A and 2B provide a graphical representation of the interpolation concept.

Folding circuits in the past have been implemented in bipolar semiconductor technology and generate folded voltage signals. A CMOS current folding circuit implemented by a number of differential pairs have been proposed in Michael Flynn et al., CMOS Folding ADCs with *Current-Mode Interpolation, IEEE International Solid-State Circuits Conference,* Feb. 17, 1995; and Michael Flynn et al., CMOS Folding A/D Converters with *Current-Mode Interpolation, IEEE Journal of Solid-State Circuits,* Vol. 31, No. 9, September 1996 (both incorporated by reference and hereinafter referred to as "Flynn et al."). A current signal interpolating technique using current dividers is also proposed in Flynn et al. When the folding and interpolating techniques are both employed in an analog-to-digital converter the signal path becomes longer because of the added layers of circuitry. This may result in slowing down the converter. Further, the transistors in the current divider may need to be relatively large in size for device matching. With the use of large devices, the large capacitance associated therewith may further contribute to a slower circuit. To function at low supply voltage levels, this scheme may also require additional circuitry, such as current mirrors.

SUMMARY OF THE INVENTION

Accordingly, there is a need for an improved folding and interpolator circuit for an analog-to-digital converter.

In accordance with the present invention, a differential-pair based current folding interpolator circuit is provided which eliminates or substantially reduces the disadvantages associated with prior circuits.

In one aspect of the invention, a current folding and interpolating circuit in an analog-to-digital converter has L folders, each of them includes M differential pairs, each having N first transistors with source terminals coupled together and biased by an input voltage and N second transistors with source terminals coupled together and biased by 3 reference voltages, and a current source coupled to the source terminals of the first and second transistors. The second transistors of different differential pairs are biased by different reference voltages. Selected drain terminals of the first transistors of one folder are coupled to selected drain terminals of the first transistors of at least one other folder, and selected drain terminals of the second transistors of one folder are coupled to selected drain terminals of the second transistors of at least one other folder. More than one interpolated signal may be generated between two folders.

In another aspect of the invention, a current folding and interpolating circuit for an analog-to-digital converter has L folders, including an $F_3$ folder, which includes N first transistors biased with an input voltage and having source terminals of the first transistors coupled to one another, N second transistors biased with a number of predetermined reference voltages and having source terminals of the second transistors coupled to the source terminals of the first transistors. A first current source is coupled to the source terminals of the first and second transistors for creating a total current flow in the first and second transistors of the quantity, I, and a current of the quantity, $I_1/N$, in each of the first transistors, a current of the quantity, $I_2/N$, in each of the second transistors, where $I=I_1+I_2$. An $F_5$ folder includes N third transistors biased with a number of predetermined reference voltages and having source terminals of the third transistors coupled to one another, N fourth transistors biased with the input voltage and having source terminals of the third transistors coupled to the source terminals of the fourth transistors, and a second current source coupled to the source terminals of the third and fourth transistors for creating a total current flow in the third and fourth transistors of the quantity, I, and a current of the quantity, $I_3/N$, in each of the first transistors, a current of the quantity, $I_4/N$, in each of the second transistors, where $I=I_3+I_4$. The drain terminals of one of the second transistors and one of the third transistors are coupled together resulting in an interpolated current, $I_{F4+}=I_2/N+I_3/N$, the second terminals of two of the first transistors are coupled together resulting in a current, $I_{F3-}=2I_1/N$, and the drain terminals of two of the second transistors being coupled together resulting in a current, $I_{F3+}=2I_2/N$.

In yet another aspect of the invention, in a hard disk read channel, the analog-to-digital converter includes a folding and interpolating circuit with L folders. Each folder includes M differential pairs, each having N first transistors with source terminals coupled together and biased by an input voltage and N second transistors with source terminals coupled together and biased by a reference voltage, and a current source coupled to the source terminals of the first and second transistors. The second transistors of different differential pairs are biased with different reference voltages. Selected drain terminals of the first transistors of one folder are coupled to selected drain terminals of the first transistors of at least one other folder, and selected drain terminals of the second transistors of one folder are coupled to selected drain terminals of the second transistors of at least one other folder. 2L comparators are coupled to predetermine drain terminals of the first and second transistors of the L folders. A decoder is coupled to the comparators and generates a digital cyclic thermometer code representation of the input voltage.

A technical advantage of the present invention reduces the number of circuit stages and internal nodes in the folding and interpolating circuit. The number of devices is also reduced and the resultant routing becomes less complex. This simpler circuit is thus capable of operating at a faster speed. Further, the folding interpolator circuit of the present invention is also capable of operating with very low supply voltages.

BRIEF DESCRIPTION OF THE DRAWINGS

For a better understanding of the present invention, reference may be made to the accompanying drawings, in which.

DETAILED DESCRIPTION OF THE INVENTION

The preferred embodiments of the present invention are illustrated in FIGS. 1–7, like reference numerals being used to refer to like and corresponding parts of the various drawings.

Figure 3:
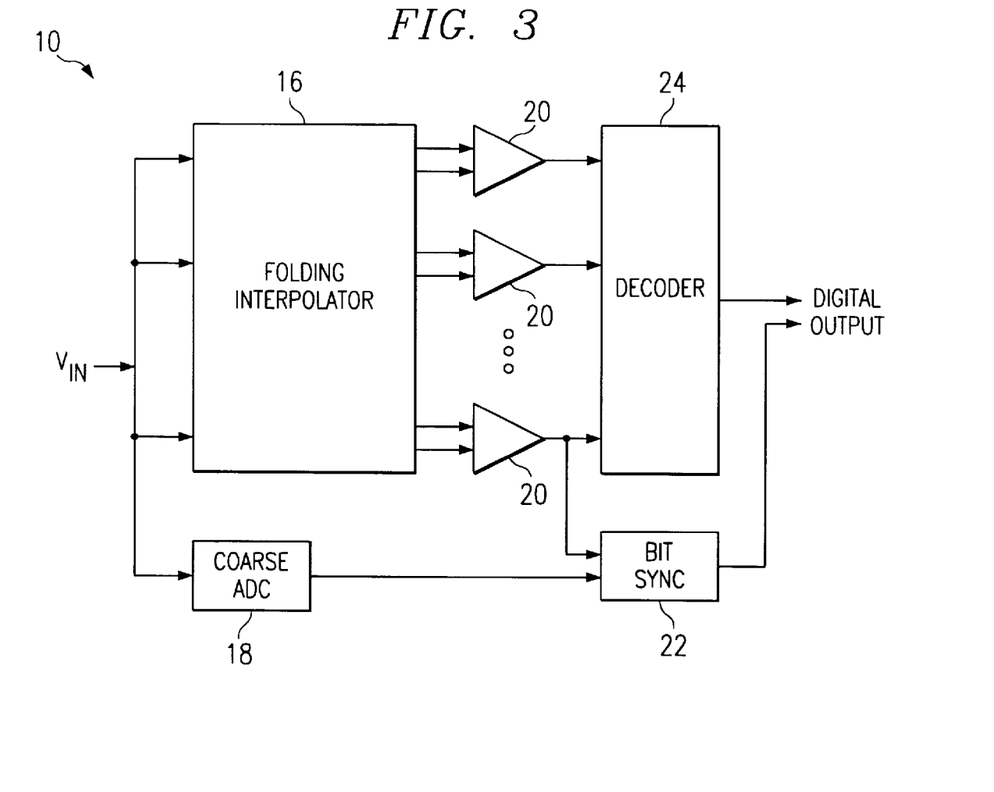
FIG. 3 is a simplified block diagram of a folding and interpolating analog-to-digital converter according to the teachings of the present invention.

Referring to FIG. 3, a block diagram of a folding and interpolating analog-to-digital converter 10 constructed according to the teachings of the present invention is shown. Converter 10 includes a folding interpolator circuit 16 receiving the input analog voltage, $V_{IN}$, and ascending reference voltage levels derived from a resistor ladder (not shown), for example. To increase the accuracy of converter 10, folding interpolator 16 also generates the complements of the folded current signals for comparison. The folded current signals and their complement current signals are used to produce interpolated or intermediate folded current signals and complements. A coarse analog-to-digital converter 18 is used to generate the most significant bits (MSBs) of the digital output. Intermediate folded signals and complements and the original folded signals and complements generated by folding interpolator circuit 16 are received by a number of differential comparators 20. Differential comparators 20 generate a cyclic thermometer code that is then decoded by a decoder 24 to generate a digital output signal. A bit synchronizer 22 coupled to coarse analog-to-digital converter 18 is used to synchronize the most significant and least significant bits of the digital output signal. A more detailed description of an exemplary implementation of converter 10 is available by referring to Flynn et al.

Figure 4:
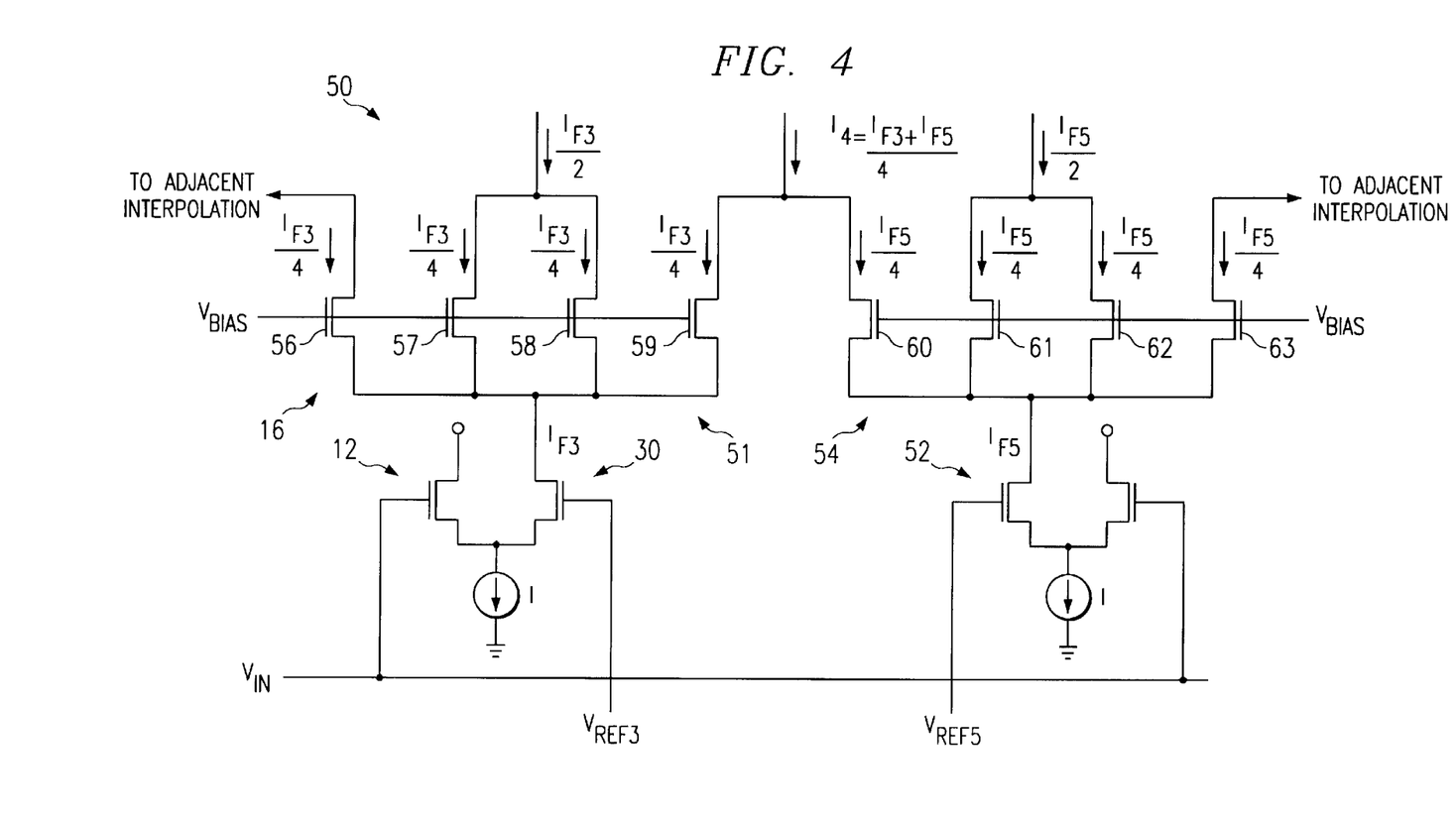
FIG. 4 is a schematic diagram of a known current-based folder and interpolating circuit.
Figure 5:
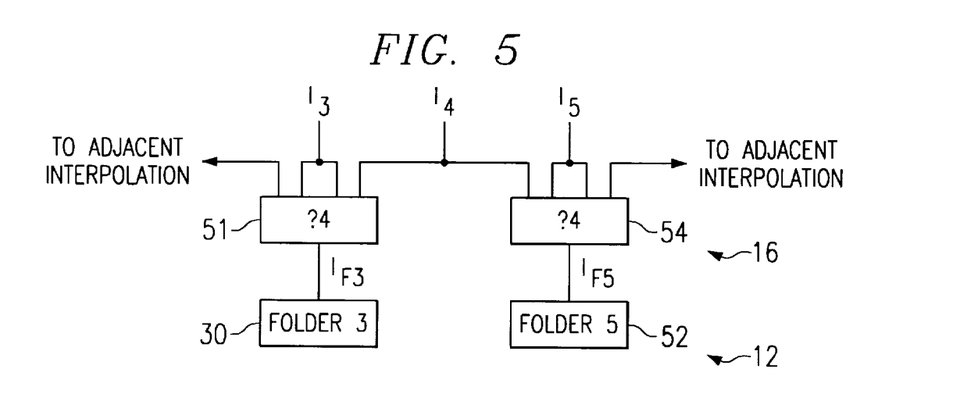
FIG. 5 is a simplified block diagram of the known current based folder and interpolating circuit of FIG. 2.

FIG. 4 is a schematic diagram of a current folder and interpolating circuit 50 which is described in Flynn et al. FIG. 5 is a simplified block diagram of circuit 50 which may aid in the understanding of circuit 50. Circuit 50 includes folder circuits 12 coupled to interpolator circuit 16. Folder circuits 12 includes a number of n-channel MOSFET (nMOS) differential pairs 30 and 52 which are coupled to the input voltage, $V_{IN}$, at one input and to reference voltages, $V_{REF3}$ and $V_{REF5}$, at the other input. Folder circuit 12 generates a fold current, $I_{F3}$, and folder circuit 52 generates a fold current, $I_{F5}$. Folder circuit 12 is coupled to a current divider circuit 51, and folder circuit 52 is coupled to a second current divider circuit 54. Divider circuit 51 includes four substantially identically-sized NMOS transistors 56–59 with their source terminals connected to one another and to the drain of one of the nMOS transistors in differential pair 30. The gate terminals of transistors 56–59 are coupled to a bias voltage, $V_{BIAS}$. The drain terminals of transistors 57 and 58 are coupled together, and the drain terminal of transistor 56 is coupled to an adjacent current divider (not shown).

Folder circuit 52 is coupled to current divider circuit 54, which also includes four nMOS transistors 60–63 with their source terminals coupled together. Transistors 60–63 are also gated by bias voltage, $V_{BIAS}$. The drain terminals of transistors 61 and 62 are coupled together, and the drain of transistor 63 is coupled to adjacent current dividers (not shown). The drain terminal of transistor 60 of current divider 54 is coupled to the drain terminal of transistor 59 of current divider 51.

In operation, differential pair 30 generates fold current, $I_{F3}$, which is the sum of the currents flowing in common-source transistors 56–59. Similarly, differential pair 52 generates fold current, $I_{F5}$, which is the sum of the currents flowing in common-source transistors 60–63. Since the size of transistors 56–59 are substantially the same, $I_{F3}$ is substantially equally divided in transistors 56–59. Therefore, ¼ of $I_{F3}$ flows in each of transistors 56–59. Similarly, ¼ of $I_{F5}$ flows in each of transistors 60–63. $I_4$ is the resultant interpolated current signal, and is the sum of $I_{F3}/4$ and $I_{F5}/4$. $I_{F3}/2=I_3$ becomes the fold current signal for folder 3, and $I_{F3}/4 = I_5$ becomes the fold current signal for folder 5. In this implementation, the order of interpolation is two. Higher order interpolation may be realized by using additional current dividing transistors. The disadvantage associated with this approach is the addition of extra internal nodes to the circuit which directly translates to longer signal path and slower speed. Further, the current dividing transistors are required to be relatively large for matching, which results in larger capacitances that may also considerably slow down the circuit. Additionally, this implementation may not function properly at low supply voltages of around 2.5 V without additional current folding and mirroring circuitry.

Figure 6:
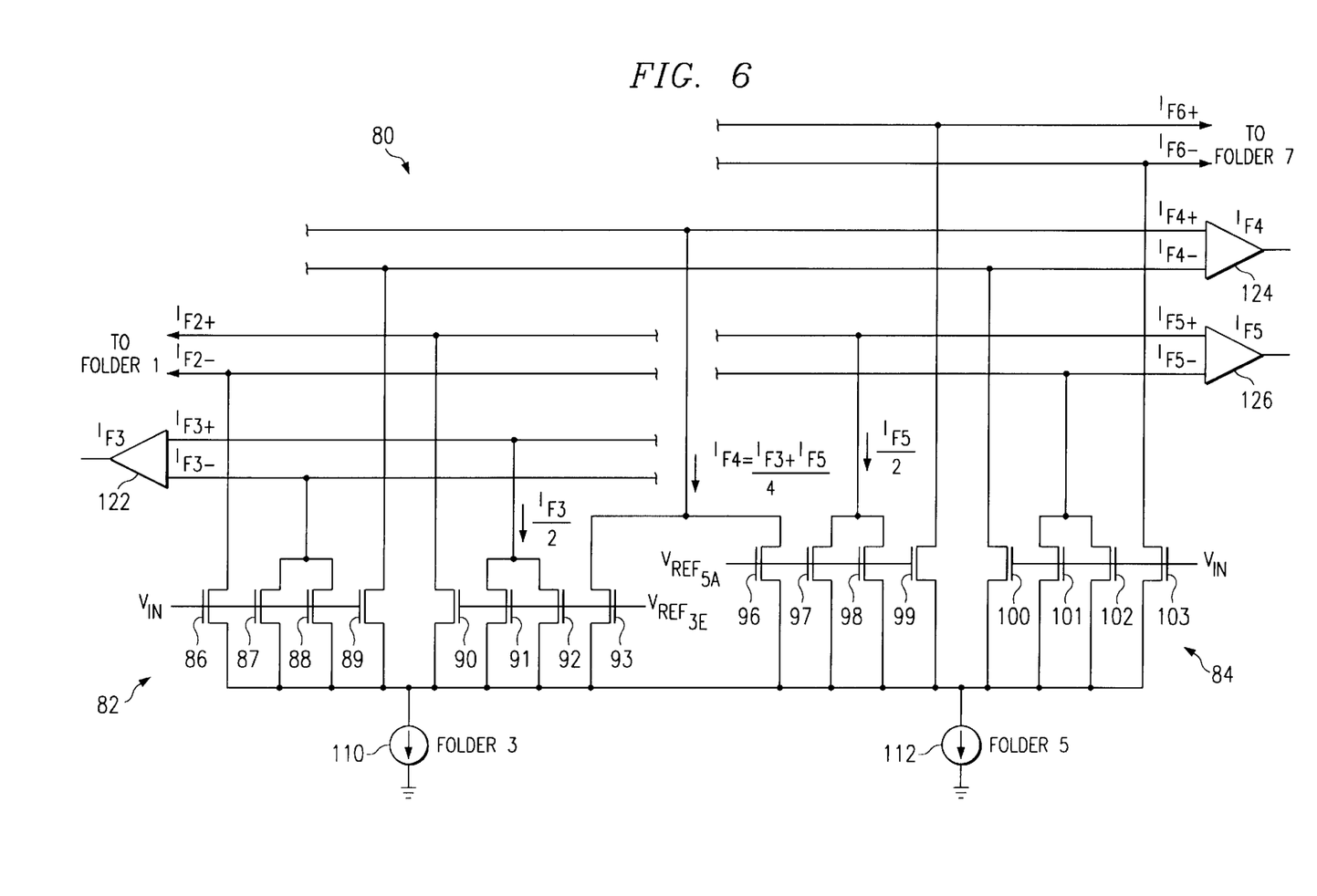
FIG. 6 is a schematic diagram of a current-based differential pair folder and interpolating according to an embodiment of the present invention.

Referring to FIG. 6, a current folding and interpolating circuitry 80 constructed according to an embodiment of the present invention is shown. Because it would be difficult to clearly show the entire circuitry 80, only a portion thereof is illustrated in FIG. 6. Current folding and interpolating circuitry 80 includes a differential pair 82 of one folding interpolator, representing folder 3, and a differential pair 84 of an adjacent folding interpolator, representing folder 5. Folding interpolator differential pair 82 includes eight nMOS transistors 86–93, with their source terminals coupled to a current source 110. Transistors 86–89 are biased by the input voltage, VIN, which is coupled to their gate terminals. Transistors 90–93 are biased by a reference voltage, $V_{REF\_3E}$, which may be generated by a circuit such as a resistor ladder circuit (not shown). Similarly, folding interpolator differential pair 84 also includes eight NMOS transistors 96–103, with their sources coupled to a current source 112. Transistors 96–99 are biased by a reference voltage, $V_{REF\_5A}$. Transistors 100–103 are biased by the input voltage, $V_{IN}$. It may be seen that transistors 86–93 are arranged in a differential pair configuration, and transistors 96–103 are also arranged in a differential pair configuration.

Folding interpolator differential pairs 82 and 84 are coupled to comparators 120–126 for folding currents $I_{F2}$–$I_{F7}$, which receive the original as well as the interpolated current signals and their complements generated by folding interpolator differential pairs 82 and 84 and neighboring folding interpolators (not shown) for comparison. The drain of transistor 86 is coupled to the $I_{F2-}$ input of $I_{F2}$ comparator (not shown). The drain terminals of transistors 87 and 88 are both coupled to the $I_{F3-}$ input of $I_{F3}$ comparator 122. The drain of transistor 89 is coupled to the $I_{F4-}$ input of $I_{F4}$ comparator 124. The drain of transistor 90 is coupled to the $I_{F2+}$ input of $I_{F2}$ comparator 120. The drain terminal of transistors 91 and 92 are both coupled to the $I_{F3+}$ input of $I_{F3}$ comparator 122. The drain terminals of transistor 93 of folder 3 and transistor 96 of folder 5 are both coupled to the $I_{F4+}$ input of $I_{F4}$ comparator 124. The drain terminals of transistors 97 and 98 are coupled to the $I_{F5+}$ input of $I_{F5}$ comparator 126. The drain of transistor 99 is coupled to the $I_{F6+}$ input of $I_{F6}$ comparator (not shown). The drain of transistor 100- is coupled to the $I_{F4-}$ input of $I_{F4}$ comparator 124. The drain terminals of transistors 101 and 102 are both coupled to the $I_{F5-}$ input of $I_{F5}$ comparator 126.

It may be seen that for folder 3, the current signals are coupled to $I_{F2}$, $I_{F3}$, and $I_{F4}$ comparators 120–124, and the current signals for folder 5 are coupled to $I_{F4}$, $I_{F5}$, and $I_{F6}$ comparators 124–126 ($I_{F6}$ comparator not shown). Therefore, the current signals generated by each folder is used for its own current comparison as well as comparisons for the neighboring comparators. In the example shown in FIG. 6, $I_{F4+}$, and $I_{F4-}$ are the interpolated signals using current signals generated in neighboring folders 3 and 5, resulting in an order of interpolation of 2.

Constructed in this manner, folding and interpolating circuit 80 does not include the internal nodes between the folders and current dividers added by the implementation shown in FIG. 5. This directly translates to faster circuit speed. Further, circuit 80 has a reduced device count and simpler routing. More importantly, circuit 80 is capable of operating with low supply voltages. It may be seen that an alternate embodiment of circuit 80 includes the use of p-channel MOSFETs (pMOS).

Figure 7:
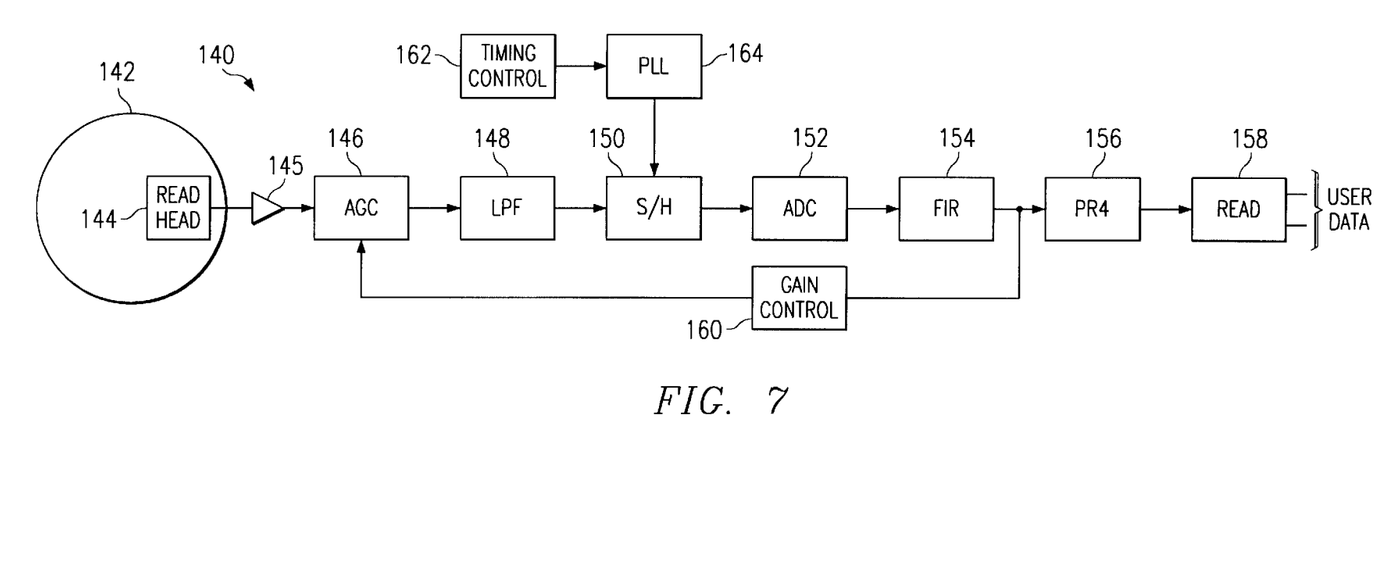
FIG. 7 is a block diagram of a folding and interpolating analog-to-dialog converter in a mass storage device application.

FIG. 7 is a simplified block diagram of a hard disk drive read channel 140 which may employ the differential-pair based folding and interpolating analog-to-digital converter of the present invention. A specific sector of a disk platter 142 is read by a read head 144. Read channel 140 includes a preamplifier 145 coupled to an automatic gain control (AGC) circuit 146, which is coupled to a low pass filter (LPF) 148, a sample and hold circuit (S/H) 150, an analog-to-digital converter (ADC) 152, a finite impulse response (FIR) filter, a Viterbi detector (PR4) 156, and a read circuit module 158 which further conditions the signal. A gain control circuit 160- is coupled to the output of finite impulse response filter 154 and provides a control signal to automatic gain control circuit 146. Further a timing circuit 162 is coupled to a phase locked loop (PLL) 164, which supplies its output to the sample and hold circuit 150. Differential-pair based current folding and interpolating techniques according to the teachings of the present invention may be employed in analog-to-digital converter 152 of hard disk drive read channel 140 in addition to many other applications.

Read head 144 senses the changes in the magnetic flux of disk platter 142 and generates a corresponding analog read signal. The read signal is first amplified by a preamplifier 145 and further amplified to an appropriate level by an automatic gain control circuit 146. Automatic gain and control circuit 146 receives feedback control signal from the output of finite impulse response filter 154 so that appropriate adjustments may be made in the amplification or gain of the read signal. The amplified analog read signal is provided to low pass filter 148, which filters the signal to remove unwanted high frequency noise. Low pass filter 148 may also provide waveform shaping and amplitude boosting. The filtered read signal is then provided to sample and hold circuit 150. Sample and hold circuit 150 synchronously samples the continuous time read signal at discrete times and holds the sampled value until the next sample time. Phase locked loop 164 controls sample and hold circuit 150 by providing a clock signal indicating the sample time. The output from circuit 150 is a discrete time analog signal. Each discrete value corresponds to the value or amplitude of the filtered output signal at the time the signal was sampled by circuit 150.

Analog-to-digital converter 152 receives the discrete time analog signals and converts it to a digital signal. Analog-to-digital converter 152 utilizes current folding and interpolating techniques according to the teachings of the present invention.

Finite impulse response filter 154 receives the digital output from analog-to-digital converter 152 and provides a discrete equalized signal that is equalized to the target function of viterbi detector 156. Viterbi detector 156 receives the discrete equalized signal from finite impulse response filter 154 and analyzes the signal to produce an output signal corresponding to the data stored on the disk/head assembly (not shown) of the disk drive. Viterbi detector 156 is a maximum likelihood detector or viterbi decoder implementing the viterbi algorithm for analyzing the partial response signal provided by the discrete equalized signal from finite impulse response filter 154. The output from viterbi detector 156 is then provided to read module 158 which further conditions the signal to derive the user data read from the hard disk drive. Although the hard disk read channel is described herein, the analog-to-digital converter of the present invention is applicable to many other signal processing applications.

Constructed in this manner, current signals are folded and interpolated rather than the conventional voltage signals. Additionally, the number of internal nodes and the number of devices are reduced so that circuit speed is greatly improved. The folding interpolating circuit is also capable of operating under very low supply voltages.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A current folding and interpolating circuit in an analog-to-digital converter for converting an analog input voltage to a digital output, comprising:

L folders, where L is greater than 1, each comprising:
M differential pairs, where M is greater than 1, each of said differential pairs having N first transistors, where N is greater than 1, said first transistors having source terminals coupled together and biased by said analog input voltage and N second transistors with source terminals coupled together and biased by a reference voltage, and a current source coupled to the source terminals of the first and second transistors;
selected drain terminals of the first transistors of one folder being coupled to selected drain terminals of the first transistors of at least one other folder for generating at least one interpolated signal; and
selected drain terminals of the second transistors of one folder being coupled to selected drain terminals of the second transistors of at least one other folder for generating at least one interpolated signal.

2. The current folding and interpolating circuit, as set forth in claim 1, wherein the first and second transistors are n-channel MOSFETs.

3. The current folding and interpolating circuit, as set forth in claim 1, wherein the first and second transistors are p-channel MOSFETs.

4. The current folding and interpolating circuit, as set forth in claim 1, further comprising 2L comparators coupled to predetermined drain terminals of the first and second transistors of the L folders.

5. The current folding and interpolating circuit, as set forth in claim 1, wherein selected drain terminals of the first transistors of each folder are coupled together.

6. The current folding and interpolating circuit, as set forth in claim 1, wherein selected drain terminals of the second transistors of each folder are coupled together.

7. The current folding and interpolating circuit as set forth in claim 1, wherein the second transistors of different folders are biased by different reference voltages.

8. A current folding and interpolating circuit for an analog-to-digital converter for converting an analog input voltage to a digital output, comprising:

L folders, including an $F_3$ folder having M differential pairs, where M is greater than 1, each comprising:
N first transistors, where N is greater than 1, said first transistors being biased with said analog input voltage and having source terminals of the first transistors being coupled to one another;
N second transistors being biased with a first predetermined reference voltage and having source terminals of the second transistors being coupled to the source terminals of the first transistors;
a first current source being coupled to the source terminals of the first and second transistors and creating a total current flow in the first and second transistors of the quantity, I, and a current of the quantity, $I_1/N$, in each of the first transistors, a current of the quantity, $I_2N$, in each of the second transistors, where $I=I_1+I_2$;
an $F_5$ folder having M differential pairs, each comprising:
N third transistors being biased with a second predetermined reference voltage and having source terminals of the third transistors being coupled to one another;
N fourth transistors being biased with the analog input voltage and having source terminals of the fourth transistors being coupled to the source terminals of the fourth transistors;
a second current source being coupled to the source terminals of the third and fourth transistors and creating a total current flow in the third and fourth transistors of the quantity, I, and a current of the quantity, $I_3/N$, in each of the first transistors, a current of the quantity, $I_4/N$, in each of the second transistors, where $I=I_{3+I4}$;
the drain terminals of one of the second transistors and one of the third transistors being coupled together resulting in an interpolated current $I_{F4+}=I_2/N+I_3/N$;
the drain terminals of two of the first transistors being coupled together resulting in a current, $I_{F3}=2I_1/N$; and
the drain terminals of two of the second transistors being coupled together resulting in a current, $I_{F3+}=2I_2/N$.

9. The current folding and interpolating circuit, as set forth in claim 8, wherein the first and second transistors are n-channel MOSFETs.

10. The current folding and interpolating circuit, as set forth in claim 8, wherein the first and second transistors are p-channel MOSFETs.

11. In a hard disk read channel, an analog-to-digital converter for converting an analog input voltage to a digital output comprising:

a folding and interpolating circuit comprising:
L folders, where L is greater than 1, each comprising:
M differential pairs, where M is greater than 1, each having N first transistors, where N is greater than 1, said first transistors biased by said analog input voltage and N second transistors biased by a reference voltage; and
a current source coupled to the source terminals of the first and second transistors;
selected drain terminals of the first transistors of one folder being coupled to selected drain terminals of the first transistors of at least one other folder for generating at least one interpolated signal;
selected drain terminals of the second transistors of one folder being coupled to selected drain terminals of the second transistors of at least one other folder for generating at least one interpolated signal;
2L comparators coupled to predetermined drain terminals of the first and second transistors of the L folders; and
a decoder coupled to the comparators and generating a digital cyclic thermometer code representation of the input voltage.

12. The analog-to-digital converter, as set forth in claim 11, wherein the first and second transistors of the L folders are n-channel MOSFETs.

13. The analog-to-digital converter, as set forth in claim 11, wherein the first and second transistors of the L folders are p-channel MOSFETs.

14. The analog-to-digital converter, as set forth in claim 11, wherein selected drain terminals of the first transistors of each folder are coupled together.

15. The analog-to-digital converter, as set forth in claim 11, wherein selected drain terminals of the second transistors of each folder are coupled together.

16. The analog-to-digital converter as set forth in claim 10, wherein the second transistors of different folders are biased by different reference voltages.

* * * * *

UNITED STATES PATENT AND TRADEMARK OFFICE
CERTIFICATE OF CORRECTION

PATENT NO. : 6,175,323 B1
DATED : January 16, 2001
INVENTOR(S) : Michael P. Flynn Page 1 of 1

It is certified that error appears in the above-identified patent and that said Letters Patent is hereby corrected as shown below:

Title page, left column
Under "Filed: Aug 13, 1998" insert: -- Related U. S. Application Data Provisional application No. 60/055,907 , Aug. 15, 1997 --.

Column 1,
Line 3, insert: -- This application claims priority under 35 USC 119(e)(1) of provisional application number 60/055,907, filed 08/15/97. --

Signed and Sealed this

Twenty-third Day of October, 2001

Attest:

Attesting Officer

NICHOLAS P. GODICI
Acting Director of the United States Patent and Trademark Office